United States Patent [19]
Martin

[11] 3,893,159
[45] July 1, 1975

[54] MULTIPLE CELL HIGH FREQUENCY POWER SEMICONDUCTOR DEVICE HAVING BOND WIRES OF DIFFERING INDUCTANCE FROM CELL TO CELL

[75] Inventor: Irving Edwin Martin, Somerville, N.J.

[73] Assignee: RCA Corporation, New York, N.Y.

[22] Filed: Feb. 26, 1974

[21] Appl. No.: 445,971

[52] U.S. Cl. ........................ 357/70; 357/65; 357/75
[51] Int. Cl. ............................ H01l 3/00; H01l 5/00
[58] Field of Search ............ 357/74, 75, 68, 70, 69, 357/65

[56] References Cited

UNITED STATES PATENTS

| | | | |
|---|---|---|---|
| 3,486,082 | 12/1969 | Sakamoto | 357/74 |
| 3,500,066 | 3/1970 | Dritchett | 357/74 |
| 3,713,006 | 1/1973 | Litty et al. | 357/74 |
| 3,784,884 | 1/1974 | Zoroglu | 357/74 |
| 3,825,805 | 7/1974 | Belohoubeck | 357/74 |

*Primary Examiner*—Andrew J. James
*Attorney, Agent, or Firm*—H. Christoffersen; M. Epstein

[57] ABSTRACT

The device comprises a plurality of side by side transistor cells individually connected by a plurality of lead wires in a side-by-side lead wire array having a central axis. For reducing the effects of variations of mutual inductance among the various lead wires, and for providing a more uniform temperature from cell to cell, the individual lead wires are designed to have a self-inductance the magnitude of which is directly related to the distance of the particular lead wire from the central axis.

3 Claims, 3 Drawing Figures

MULTIPLE CELL HIGH FREQUENCY POWER SEMICONDUCTOR DEVICE HAVING BOND WIRES OF DIFFERING INDUCTANCE FROM CELL TO CELL

This invention relates to semiconductor devices, and particularly to high frequency, power semiconductor devices.

For the purpose of high output power, it is known to incorporate, within a single device envelope, a plurality of parallel connected individual transistor cells. The device has a single input terminal, and connection means, usually lead wires, connecting the terminal to each cell. Owing to variations in the characteristics of each cell, variations in the impedance between the input terminal and each cell, and other factors, a problem in the past has been that of obtaining proper drive of each cell to operate it at its maximum output to obtain maximum power output from the device.

Figure 1:
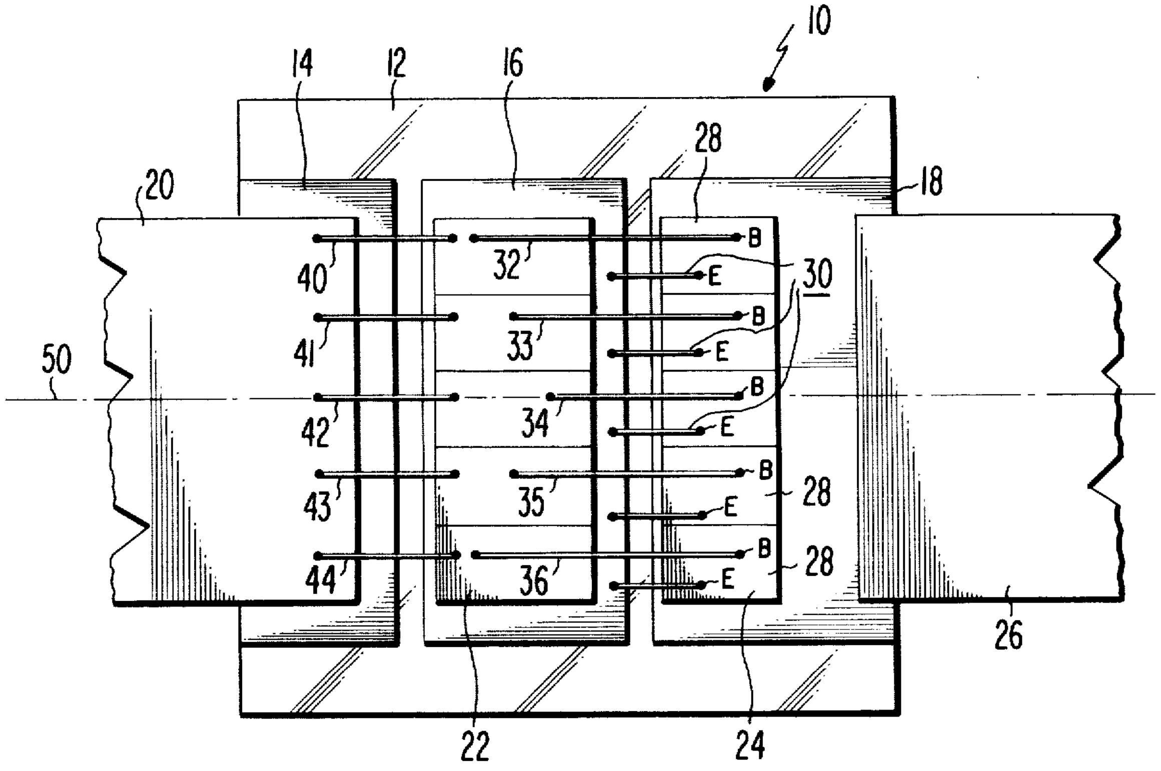
FIG. 1 shows a plan view of the device made in accordance with this invention.

The devices shown in the drawings, with the exception of certain features described below, are generally known, and are thus not described in detail. Descriptions of examples of some of the types of devices with which the instant invention has utility are provided in U.S. Pat. Nos. 3,713,006, issued on Jan. 23, 1973; 3,641,398, issued on Feb. 8, 1972; 3,651,434 issued on Mar. 21, 1972; and 3,710,202 issued on Jan. 9, 1973.

As shown in FIG. 1 herein, an inventive device 10 comprises a substrate 12, generally of ceramic, having three metallized areas 14, 16 and 18, generally of gold plated copper, thereon. Mounted on the three areas, as by brazing, are an input lead 20, a capacitor array 22, a semiconductor chip 24, and an output lead 26.

The capacitor array 22 comprises a plurality of side by side capacitors formed in a body of semiconductor material, e.g., silicon, each capacitor having a top and bottom electrode or plate of metal, e.g., aluminum. The bottom plate of each capacitor is electrically connected to the metallized area 16. Terminal means, not shown, are electrically connected to the area 16, as by brazing.

The semiconductor chip 24 includes a plurality (5 shown, although many more may be used) of transistor cells 28, each cell including an emitter, base, and collector region. The collector regions of all the cells 28 are electrically connected to the metallized area 18 through the bottom surface of the chip. The output lead 26, connected to the area 18, is thus electrically connected to each of the cell collector regions.

The emitter and base regions of each cell extend to the upper surface of the chip 24, electrical access to each such region being at the points marked E (emitter regions) and B (base regions) in the drawing.

The emitter regions of the various cells 28 are individually connected to the metallized area 16 by a set of lead wires 30, and the base regions of the various cells are individually connected to the top plate of different ones of the capacitors of the array 22 by a set of lead wires, 32, 33, 34, 35, and 36. Each capacitor top plate, in turn, is individually connected to the input lead 20 by a set of lead wires 40, 41, 42, 43 and 44.

At high frequencies, each of the various lead wires has a significant inductance which, as known, affects the characteristics of the device. Thus, in this illustrative embodiment, each of the transistor cells 28 is connected to the device input lead 20 through an impedance transforming LCL network of known type, the capacitor array 22 providing the individual capacitor elements of the networks, and the pairs of lead wires on opposite sides of the capacitor array 22 providing the network inductive elements.

As noted above, for maximum output power from the device 10, each transistor cell should be operated at its maximum output. Towards this end, it has been the practice to attempt to avoid variations in the operation of each cell by driving the cells with equal input signals. Heretofore, one means used to accomplish this is to make the various elements of the input networks as physically identical as possible, thus supposedly providing input networks of uniform impedance.

I recognized, however, that providing networks of identical structural characteristics does not necessarily result in input networks having identical impedance from cell to cell. This occurs because the actual impedance of each network is a function of its location with respect to the other networks. For example, the actual or total inductance of each lead wire is dependent not only upon the self-inductance of the wire, that is, upon the physical characteristics and shape of the wire, but upon the mutual inductance of the wire with nearby inductors, most significantly, the other lead wires of the lead wire set.

In devices of the type shown herein the lead wires of each set are disposed in a generally side-by-side lead wire array, each lead wire array having a central axis 50 generally parallel to the lead wires. In such an array, the magnitude of the mutual inductance of each lead wire is indirectly related to the distance of the lead wire from the central axis 50. This follows because while each lead wire of each set has a mutual inductance with every other wire of the lead wires of the set, the relative positions of the lead wires within the set, and thus the mutual inductance of the lead wires, vary.

For example, while the central lead wire 34 lying on the axis 50 has a mutual inductance with two other lead wires (33 and 35) one lead wire space away, and has a mutual inductance with two lead wires (32 and 36) two lead wire spaces away, the lead wire 33 has a mutual inductance with two lead wires (32 and 34) one space away, but has a mutual inductance with only one lead wire (35) two spaces away. The mutual inductance between the lead 33 and the lead 36 is over three spaces. Thus, the mutual inductance of the lead 33 (likewise the lead 35) with the other lead wires of the lead wire set is somewhat less than that of the lead wire 34. Similarly, the mutual inductance of the outermost lead wires 32 and 36 of the set is even less.

This variation in lead inductance is corrected, in accordance with the instant invention, by varying the self-inductance of each lead in a manner to compensate for the variations in mutual inductance of the various leads depending upon the positioning thereof. That is, since, in this illustrated embodiment, the mutual inductance of the various leads 32–36 decreases with increasing distance from the lead array axis, the self-inductance of the various leads is made greater with increasing distance from this axis by, as shown in FIG. 1, using progressively longer leads. The lead length progression can be obtained simply by using longer leads, as shown in FIG. 1, the leads being both parallel to one another and lying in a common plane, or the leads (32′–36′, FIG. 2) can be arched, various height arcs being used. Also, the leads need not be parallel to one another, but can, for example, be in a generally "fanned," or diverging relationship, as shown in FIG. 3 with respect to the leads 40′–44′. Also, the self-inductance variation can be obtained by using leads of progressively smaller diameter.

Figure 2:
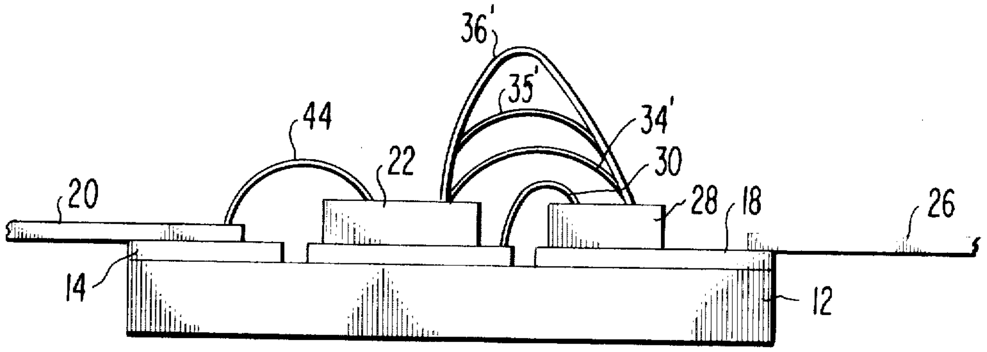
FIGS. 2 and 3 show, respectively, side and plan views of portions of different devices generally similar to the device shown in FIG. 1 but showing different embodiments of this invention.
Figure 3:
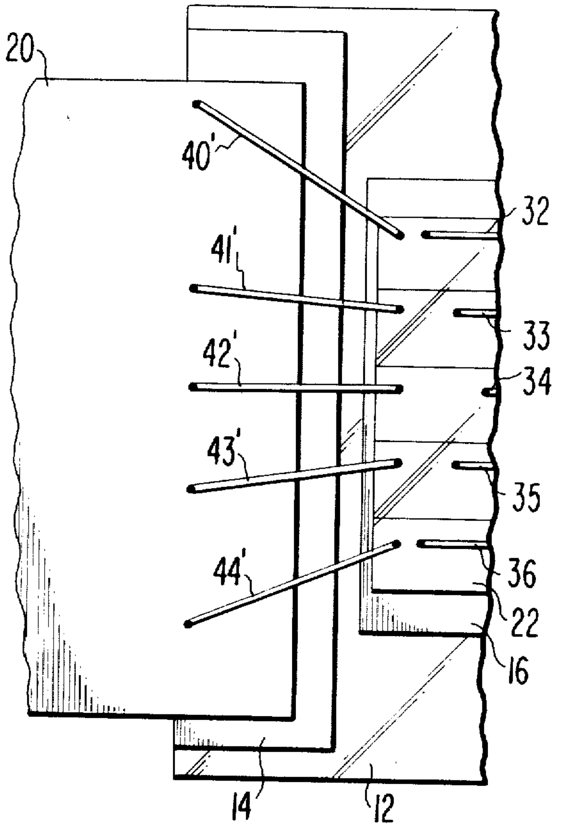

In the embodiments shown in FIGS. 1 and 2, a lead wire length variation is used with the lead wires extending between the chip 24 and the capacitor array 22. The lead wires extending between the capacitor array 22 and the input lead 20 are of equal length and are not compensated for mutual inductance variations. Such variations can be tolerated because, owing to the impedance transformation by the LCL networks, small variations in the inductance of the lead wires between the capacitor array 22 and the input lead 20 have comparatively little affect on the magnitude of the signal reaching the individual transistor cells 28. These lead wires, of course, can also be self-inductance adjusted to compensate for the mutual inductance variations therebetween as shown, for example, in FIG. 3.

As above described, it has been the practice to attempt to drive each cell with substantially identical input signal to avoid variations in the operation of the individual transistor cells I discovered, however, that identical drive of each transistor cell is actually not the preferred mode of operation and that a deviation in amplitude of the input signals to each of the transistor cells is generally desired. This follows from the fact that, for equal cell power output, the transistor cells 28 closest to the central axis of the chip 24 tend to be hotter than the cells further removed therefrom owing to the greater peripheral heat sinking available at the ends of the chip 24. If the central cell 28 is operated at its maximum safe operating temperature, the remaining cells are thus somewhat cooler and, while providing equal output as the central cell, are not providing maximum output. What is desired, therefore, is that the otherwise cooler cells be driven harder, i.e., with a greater input signal, so that all the cells operate at their maximum safe temperatures. This is most readily accomplished by progressively reducing the input impedance to each cell with increasing distance of the cells from the center of the chip, e.g., progressively reducing the length of the input lead wires with such increasing distance.

In actual practice, for example, the device is designed as follows. First, a prototype device 10 is fabricated with a set of variable length lead wires 32 through 36 designed, according to known computational processes, to compensate for the lead wire mutual inductance variations. As described, the self-inductance of these lead wires is increased with increasing distance from the cental axis 50. The device is then operated at normal operating conditions and an infra-red photograph is taken of the chip 24 to provide a picture of the thermal distribution along the chip. As above noted, with equal drive to each of the cells, the cells will be of decreasing temperature with increasing distance from the center of the chip. Thus, with the particular thermal distribution shown by the infrared photograph, depending upon many factors and thus not readily predictable, the change in input signal to each cell to equalize the temperature of the various cells is determined, and the change in input impedance to each cell is calculated. A new device 10 is then built and evaluated and the process repeated as necessary until a final design is made which provides the desired results.

While any single element, or combination of elements of the input networks can be changed to alter the impedance to the various cells, most simply, the lengths of the lead wires connected to the individual cells are changed.

As above described, this involves progressively reducing the lengths of the input leads with increasing distance from the center of the chip 24. While the particular changes depend upon the particular device involved, in general, the decreases in lead wire lengths to compensate for the chip thermal distribution are less than the increases in lead wire lengths to compensate for the mutual inductance variations. Stated differently, while the resulting device has a lead wire array in which the self-inductance of each lead wire increases with distance from the central axis, for the purpose of reducing mutual inductance variations among the lead wires, the total inductance of the various leads actually decrease with increasing distance from the array central axis to provide the desired variation in cell input signals.

What is claimed is:

1. A semiconductor device including a plurality of transistor cells, each of said cells comprising at least two regions of opposite type conductivity,
   - a plurality of lead wires individually connected to the same corresponding region of different ones of said cells,
   - said wires being disposed in a generally side by side array having a central axis,
   - the self-inductance of said wires being greater with increasing distance from said axis.

2. The device of claim 1 in which the length of said wires is greater with said increasing distance.

3. The device of claim 1 in which the total inductance of said wires decreases with said increasing distance.

* * * * *